(12) United States Patent
Uchino et al.

(10) Patent No.: US 9,095,046 B2
(45) Date of Patent: Jul. 28, 2015

(54) DEVICES AND METHODS FOR CONNECTING DEVICE COVER COMPONENTS

(71) Applicant: LENOVO (SINGAPORE) PTE. LTD., Singapore (SG)

(72) Inventors: Akinori Uchino, Yokohama (JP); Tetsuya Ohtani, Yokohama (JP); Masahiro Kitamura, Kawasaki (JP); Tatsuya Ushioda, Yokohama (JP)

(73) Assignee: LENOVO (SINGAPORE) PTE. LTD., New Tech Park (SG)

( * ) Notice: Subject to any disclaimer, the term of this patent is extended or adjusted under 35 U.S.C. 154(b) by 56 days.

(21) Appl. No.: 13/786,679

(22) Filed: Mar. 6, 2013

(65) Prior Publication Data
US 2014/0254071 A1    Sep. 11, 2014

(51) Int. Cl.
*H05K 5/00* (2006.01)
*G06F 1/16* (2006.01)
*H05K 7/00* (2006.01)
*G06F 1/18* (2006.01)

(52) U.S. Cl.
CPC .............. *H05K 5/0008* (2013.01); *G06F 1/181* (2013.01); *Y10T 29/49826* (2015.01)

(58) Field of Classification Search
CPC .... G06F 1/1613; G06F 1/1615; G06F 1/1616

USPC .............. 361/679.3, 679.58, 679.26, 679.55, 361/679.56
See application file for complete search history.

(56) References Cited

U.S. PATENT DOCUMENTS

| | | | |
|---|---|---|---|
| 5,379,182 A * | 1/1995 | Fujimori et al. | 361/679.27 |
| 5,555,157 A * | 9/1996 | Moller et al. | 361/679.3 |
| 6,532,152 B1 * | 3/2003 | White et al. | 361/692 |
| 7,227,761 B2 | 6/2007 | Estes et al. | |
| 8,446,716 B2 * | 5/2013 | Fan et al. | 361/679.21 |
| 2009/0179537 A1 | 7/2009 | Morino et al. | |

* cited by examiner

*Primary Examiner* — Anthony Haughton
(74) *Attorney, Agent, or Firm* — Nutter McClennen & Fish LLP; John J. Penny, Jr.

(57) ABSTRACT

Devices and methods are provided for connecting device cover components. In general, the devices and methods can allow first and second covers of an electronic device to be connected together at a plurality of attachment points without any gap space between the first and second covers at the attachment points. In an exemplary embodiment, an electronic device can include a housing that has first and second covers attached to one another at a plurality of attachment points. The first cover can be formed from a first material, and the second cover can be formed from a second, different material. The first material can be a softer material than the second material, which can allow the second cover to penetrate into and deform the first cover during manufacturing of the housing such that no gap space is present between the first and second covers at each of the attachment points.

19 Claims, 4 Drawing Sheets

DEVICES AND METHODS FOR CONNECTING DEVICE COVER COMPONENTS

FIELD OF THE INVENTION

The present invention relates generally to devices and methods for connecting device cover components.

BACKGROUND OF THE INVENTION

Figure 1:
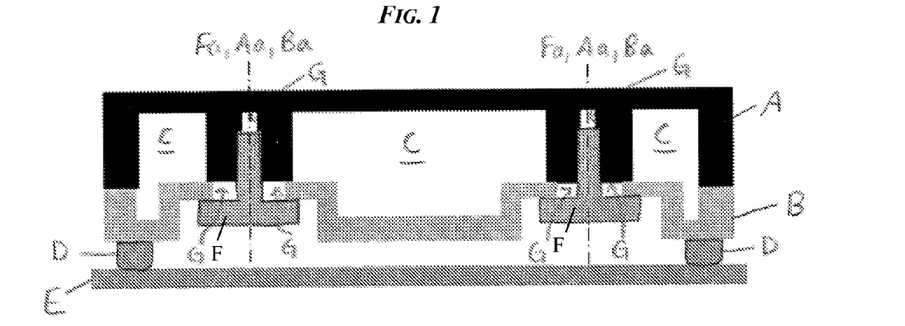
FIG. 1 is a schematic cross-sectional of an electronic device resting on a table surface.

Current electronic devices typically include a housing that encases at least some of the device's electronic parts, e.g., a memory, a processor, etc. The housing typically includes a top cover and a bottom cover attached to the top cover, with electronic parts contained between the top and bottom covers. FIG. 1 illustrates one example of a housing of an electronic device that includes a top cover A and a bottom cover B attached to the top cover A. Electronic parts are typically included in a space C between the top and bottom covers A, B but are not shown in FIG. 1 for clarity of illustration. The bottom cover B typically has a plurality of rubber feet D coupled thereto on which the electronic device can rest on a table surface E.

The top and bottom covers A, B are typically attached together using a plurality of screws F. Clearance space G exists between the screws F and the top cover A and between the screws F and the bottom cover B. The clearance space G facilitates assemblage of the top and bottom covers A, B with the screws F during manufacturing of the device. In their proper position at which the device is shipped for distribution and/or sale to consumers, as shown in FIG. 1, the screws F have axes Fa coaxially aligned with axes Aa, Ba of the top cover A and the bottom cover B, respectively. This coaxial alignment symmetrically aligns the top and bottom covers A, B and allows all the rubber feet D to rest on the table surface E.

Figure 2:
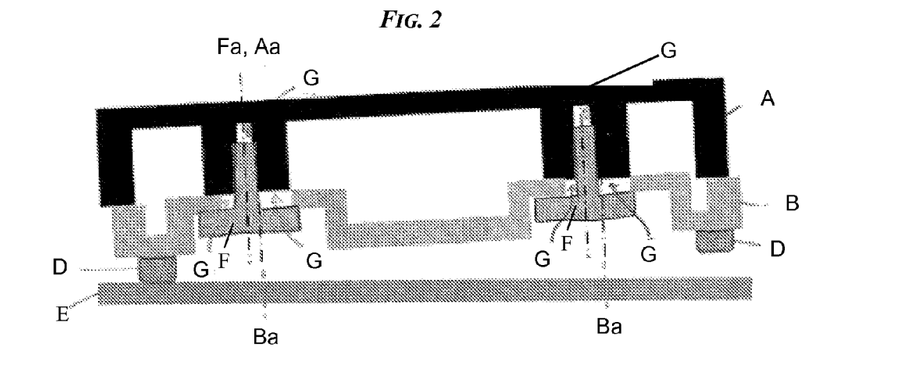
FIG. 2 is a schematic cross-sectional of the electronic device of FIG. 1 tilted on the table surface.

When the device is moved between different positions on the table surface E, is accidentally dropped, and/or is moved between different locations (e.g., transported in a carrying case between different locations, hand held between different locations, etc.), the screws F can shift in position within the clearance space G relative to the top cover A and/or the bottom cover B. The axis Fa of one or more of the screws F can therefore become misaligned from one or both of the axes Aa, Ba of the top and bottom covers A, B, as shown in FIG. 2, in which the screw axis Fa is offset from the bottom cover axis Ba. The top and bottom covers A, B are consequently twisted or otherwise misaligned relative to one another such that the rubber feet D will no longer all rest on the table surface E, as also shown in FIG. 2. The device will therefore be tilted and can rock on the table surface E as different one(s) of the feet D contact the table surface E while other(s) of the feet D do not contact the table surface E. This rocking and tilting is disruptive to the user and/or can cause damage to the electronic parts contained within the space C as the electronic parts are repeatedly jostled by the device repeatedly tilting and hitting against the table surface E as different ones of the rubber feet D contact the surface E.

The axis Fa of one or more of the screws F can become misaligned from one or both of the axes Aa, Ba of the top and bottom covers A, B during shipment of the device before a user ever receives the device, e.g., if shipment is unintentionally rough, if inadequate packing material is provided around the device and the device roughly and/or repeatedly shifts position during transport, etc. The device can thus be delivered to the user in a new but defective state, which can inconvenience the user by requiring the user to request and wait for a replacement device, can result in monetary loss to the seller due to having to replace the defective device, and/or can adversely affect the seller's reputation by selling a defective device.

In another typical electronic device, top and bottom covers of the electronic device can be attached together using a rib and a slit, e.g., a rib in the top cover seated in a slit in the bottom cover. Clearance space exists between the rib and the slit to ease manufacturing, similar to that discussed above, but the clearance space can result in rocking and tilting, also similar to that discussed above.

Accordingly, there remains a need for improved devices and methods for connecting device cover components.

SUMMARY OF THE INVENTION

In one embodiment, an apparatus is provided that includes a first cover of an electronic device having an inferior surface and a superior surface, and a second cover of the electronic device having an inferior surface and a superior surface. The superior surface of the second cover is attached to the inferior surface of the first cover at a plurality of attachment points. At each of the attachment points, one of the superior surface of the second cover and the inferior surface of the first cover has one or more protrusions extending therefrom that are seated in corresponding one or more depressions formed in another of the superior surface of the second cover and the inferior surface of the first cover with no gap space therebetween such that the first cover cannot rotate relative to the second cover.

One of the first and second covers can be formed from a first material, e.g., a metal, and another of the first and second covers can be formed from a second material, e.g., polymer. The first material can be a harder material than the second material.

The apparatus can include an attachment mechanism at each of the attachment points. The attachment mechanism can be seated in a hole formed through the superior surface of the second cover and the inferior surface of the first cover. In some embodiments, the one or more protrusions can include a plurality of protrusions, the one or more depressions can include a plurality of depressions, and at each of the attachments points, the plurality of protrusions and the plurality of depressions can be positioned radially around the connection member. In some embodiments, at each of the attachments points, the one or more protrusions and the one or more depressions can extend through the connection member.

The apparatus can include a third cover having a display thereon. The third cover can be movably attached to the first and second covers such that the electronic device can be moved between an open position and a closed position. When the electronic device is in the open position, the display can be configured for visualization by a user, and when the electronic device is in the closed position, the display can not be configured for visualization by the user.

The apparatus can include a processor positioned between the inferior surface of the first cover and the superior surface of the second cover. The apparatus can also include a display coupled to the first and second covers. The processor can be configured to cause data to be displayed on the display.

The inferior surface of the second cover can have a plurality of feet extending therefrom. Each of the feet can be configured to rest on a table surface.

The electronic device can include any one of a mobile telephone, a smartphone, a computer, a DVD player, a CD player, a portable music player, a gaming system, a television, a radio, and a personal digital assistant.

In another embodiment, an apparatus is provided that includes a first cover of an electronic device, a second cover of the electronic device, and a plurality of connection members. The first cover has a plurality of holes formed therein. Each of the holes has a plurality of protrusions positioned radially therearound. The second cover has a plurality of holes formed therein. The plurality of protrusions are pressed into the second cover such that a plurality of depressions are formed in the second cover in which the plurality of protrusions are seated without any gap space therebetween and such that the holes of the first cover are aligned with the holes of the second cover. Each of the connection members extends through one of the holes of the first cover and one the holes of the second cover such that each of the connection members has a plurality of the protrusions and a plurality of the depressions positioned radially therearound.

The apparatus can vary in any number of ways. For example, the plurality of holes of the first cover can be positioned around a perimeter of the first cover, and the plurality of holes of the second cover can be positioned around a perimeter of the second cover. For another example, each of the plurality of protrusions can be formed from a first material, the second cover can be formed from a second material at least where the depressions are formed therein, and the first material is harder than the second material. The first material can include a metal, and the second material can include a polymer.

In another aspect, a method is provided that in an embodiment includes connecting a first cover of an electronic device to a second cover of the electronic device such that at each of a plurality of attachments points between the first and second covers, protrusions extending from the first cover press into the second cover so as to form a plurality of depressions in the second cover with no gap space between the protrusions and the depressions. The method also includes positioning a connection member at each of the attachment points such that each of the connection members extends between the first and second covers and holds the first and second cover together in a fixed position relative to one another.

The method can have any number of variations. For example, the method can include attaching a plurality of feet to the second cover, each of the feet being configured to rest on a table surface, and attaching a display to the first cover. For another example, the method can include attaching a plurality of feet to the first cover, each of the feet being configured to rest on a table surface, and attaching a display to the second cover. For yet another example, the method can include attaching a third cover to the first and second covers such that the electronic device can be moved between an open position and a closed position. The third cover can have a display thereon. The electronic device in the open position can allow data displayed on the display to be visualized by a user, and the electronic device in the closed position can not allow data displayed on the display to be visualized by the user. For another example, the electronic device can include any one of a mobile telephone, a smartphone, a computer, a DVD player, a CD player, a portable music player, a gaming system, a television, a radio, and a personal digital assistant.

BRIEF DESCRIPTION OF THE DRAWINGS

The invention will be more fully understood from the following detailed description taken in conjunction with the accompanying drawings, in which.

DETAILED DESCRIPTION OF THE INVENTION

Certain exemplary embodiments will now be described to provide an overall understanding of the principles of the structure, function, manufacture, and use of the devices and methods disclosed herein. One or more examples of these embodiments are illustrated in the accompanying drawings. Those of ordinary skill in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Various exemplary devices and methods are provided for connecting device cover components. In general, the devices and methods can allow first and second covers of an electronic device to be connected together at a plurality of attachment points without any gap space between the first and second covers at the attachment points. Having no gap space between the first and second covers at the attachment points can reduce chances of the first and second covers twisting or otherwise shifting in position relative to one another during shipment and/or during use, thereby helping to prevent the electronic device from tilting or rocking when the device rests on a support surface, e.g., a table surface, a desk surface, a bookshelf, etc. In an exemplary embodiment, an electronic device can include a housing that has first and second covers attached to one another. The first and second covers can be attached together at a plurality of attachment points. The first cover can be formed from a first material, and the second cover can be formed from a second, different material. The first material can be a softer material than the second material, which can allow the second cover to penetrate into and deform the first cover during manufacturing of the housing. In other words, the second material can be hard enough and the first material can be soft enough such that when the housing is manufactured, a plurality of protrusions extending from the second cover can be pressed into, pushed into, forced into, or otherwise caused to form a plurality of depressions in the first cover. The protrusions and the depressions can be at the attachment points where the first and second covers are connected together. Because the protrusions can form the depressions, each of the depressions can have a size, shape, and location that precisely corresponds to its corresponding protrusion such that no gap space is present between the first and second cover at each of the protrusions and depressions. In other words, no gap space can exist between the first and second covers at each of the attachment points. The first and second covers can thus be securely attached together with little or no chance of the first and second covers twisting or otherwise becoming misaligned relative to one another.

A person skilled in the art will appreciate that the devices and methods disclosed herein can be implemented using any type of electronic device. Exemplary embodiments of electronic devices include a mobile telephone, a smartphone, a computer (e.g., a laptop or notebook computer, a netbook, a server, a tablet, etc.), a DVD player, a CD player, a portable music player, a gaming system, a television, a radio, a personal digital assistant (PDA), etc. In an exemplary embodiment, the electronic device is a portable device configured to be transported by a user between different locations and configured to be placed on a support surface during use and/or for storage. The electronic device can, however, be a non-portable, stationary device.

The term "display" as used herein refers to any of a variety of display devices, e.g., a liquid crystal display (LCD), a light-emitting diode (LED) screen, a cathode ray tube (CRT) screen, a touchscreen, a 3D screen, and the like. Additionally, the term "display" as used herein can refer to a display that is fixedly mounted in the same chassis or package as a base of an electronic device, as well as to displays that are removably and replaceably mounted to the same chassis or package as a base of an electronic device.

Figure 3:
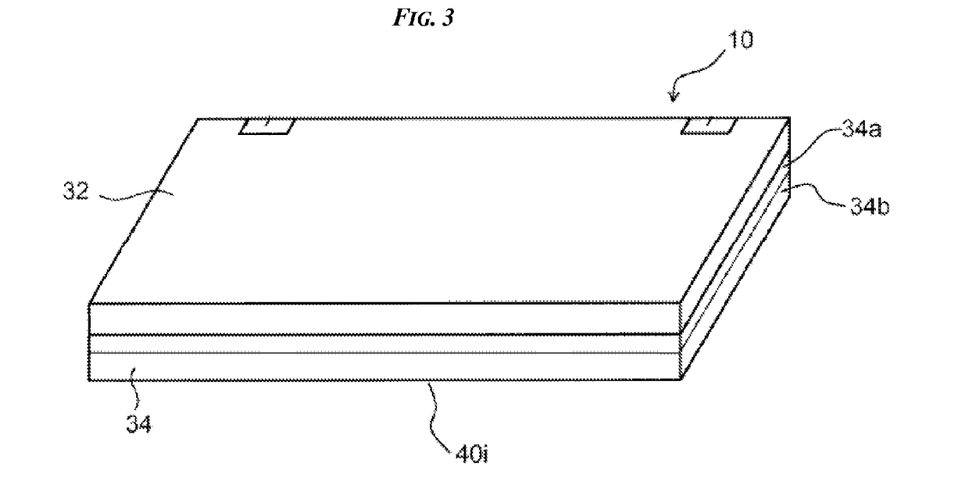
FIG. 3 is a perspective view of one embodiment of an electronic device in a closed configuration.
Figure 4:
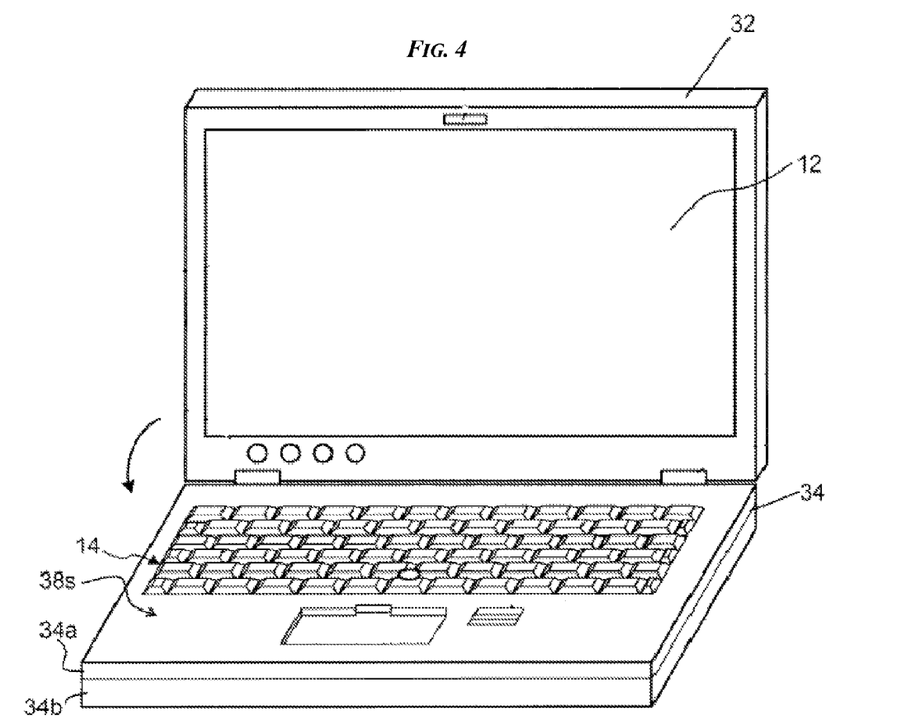
FIG. 4 is a perspective view of the electronic device of FIG. 3 in an open configuration.

FIGS. 3 and 4 illustrate one exemplary embodiment of an electronic device 10 configured to prevent tilting or rocking thereof when the device 10 rests on a support surface (not shown). Although the device 10 in this illustrated embodiment includes a laptop computer, as mentioned above, other embodiments can include other types of electronic devices. The device 10 can include any of a variety of software and/or hardware components. In addition, although an exemplary device 10 is depicted and described herein, a person skilled in the art will appreciate that this is for sake of generality and convenience. In other embodiments, the electronic device may differ in architecture and operation from that shown and described with respect to any of the illustrated embodiments.

Figure 5:
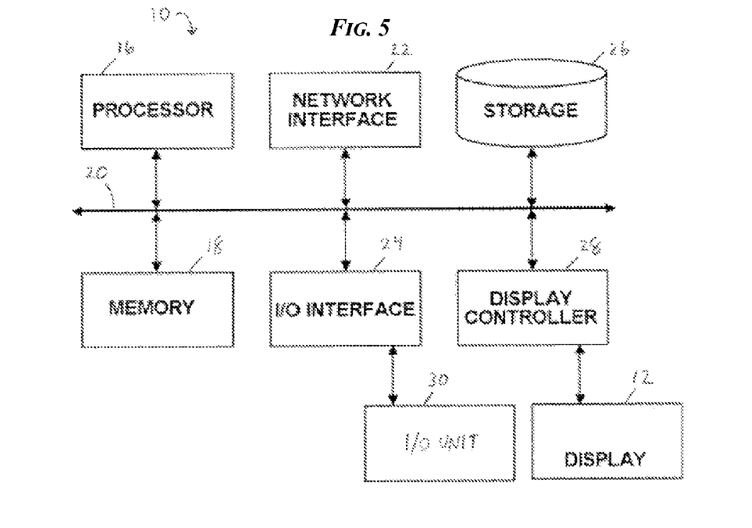
FIG. 5 is a schematic diagram of the electronic device of FIG. 3.

As shown in FIG. 5, the illustrated device 10 can include a processor 16 which controls the operation of the device 10, for example by executing an operating system (OS), a basic input/output system (BIOS), device drivers, application programs, and so forth. The processor 16 can include any type of microprocessor or central processing unit (CPU), including programmable general-purpose or special-purpose microprocessors and/or any one of a variety of proprietary or commercially-available single or multi-processor systems. The device 10 can also includes a memory 18, which can provide temporary storage for code to be executed by the processor 16 or for data that is processed by the processor 16. The memory 18 can include read-only memory (ROM), flash memory, one or more varieties of random access memory (RAM), and/or a combination of memory technologies. The various elements of the device 10 can be coupled to a bus system 20. The illustrated bus system 20 is an abstraction that a person skilled in the art will appreciate represents any one or more separate physical busses, communication lines/interfaces, and/or multi-drop or point-to-point connections, connected by appropriate bridges, adapters, and/or controllers.

The device 10 can also include a network interface 22, an input/output (I/O) interface 24, a storage device 26, and a display controller 28. The network interface 22 can enable the device 10 to communicate with remote devices, e.g., other electronic devices, over a network. The I/O interface 24 can facilitate communication between one or more I/O units 30. A person skilled in the art will appreciate that the device 10 can be configured to communicate with a variety of I/O units 30. Non-limiting examples of input units include a keyboard, a touch screen, a mouse, and a pointing device. Non-limiting examples of output units includes a speaker, a printer, a scanner, a removable memory, and the various other components of the device 10. The storage device 26 can include any conventional medium for storing data in a non-volatile and/or non-transient manner. The storage device 26 can thus hold data and/or instructions in a persistent state, i.e., the value is retained despite interruption of power to the device 10. The storage device 26 can include one or more hard disk drives, flash drives, universal serial bus (USB) drives, optical drives, various media disks or cards, and/or any combination thereof, and can be directly connected to the other components of the device 10 or remotely connected thereto, such as over a network. The display controller 28 can include a video processor and a video memory, and can generate images to be displayed on a display 12 in accordance with instructions received from the processor 16.

One or more software modules can be executed by the device 10 to facilitate human interaction with the device 10. These software modules can be part of a single program or one or more separate programs, and can be implemented in a variety of contexts, e.g., as part of an operating system, a device driver, a standalone application, and/or combinations thereof. A person skilled in the art will appreciate that any software functions being performed by a particular software module can also be performed by any other module or combination of modules.

The device 10 can be configured to open and close in a clamshell manner. A lid 32 of the device 10 and a base 34 of the device 10 can be configured to move between a closed configuration and an open configuration. As in the illustrated embodiment, the device 10 can include the lid 32 hingedly connected to the base 34 to allow the device 10 to be hingedly opened and closed, as will be appreciated by a person skilled in the art. The lid 32 can include the display 12 on an inner surface thereof, and the base 34 can include a keyboard 14 on an inner surface thereof. In this way, the display 12 and the keyboard 14 can be "hidden" when the device 10 is closed, which can help protect the display 12 and the keyboard 14 from damage when not in use. FIG. 3 shows the device 10 in a closed configuration, and FIG. 4 shows the device 10 in an open configuration. A person skilled in the art will appreciate that when the device 10 is in the open configuration, the lid 32 and the base 34 can be at a variety of selectable angles relative to one another and not only at the angle shown in FIG. 4.

The base 34 and/or the lid 32 can include a release mechanism configured to be manually actuated by a user to allow the device 10 to be moved from the closed configuration to the open configuration, as will be appreciated by a person skilled in the art.

Although the display 12 in this illustrated embodiment is on the inner surface of the lid 32, the display 12 can be on the lid 32, the base 34, and/or an external device (e.g., an external monitor, etc). The device 10 can include more than one display 12. As will be appreciated by a person skilled in the art, the lid 32 can include any number of elements in addition to the display 12. Non-limiting examples of elements that can be included in the lid 32 are one or more additional displays, a power control (e.g., a button, a switch, etc.), a port (e.g., a USB port, a FireWire port, an Ethernet port, etc.), a close or lock latch to help hold the device 10 closed, a parameter control (e.g., brightness, contrast, etc.), etc.

As mentioned above, the inner surface of the base 34 can have the keyboard thereon, e.g., on a surface that faces the lid 32 and the display 12 when the device 10 is closed. The base 34 can include any number of elements in addition to the keyboard. Non-limiting examples of elements that can be included in the base 34 are a pointing stick, a touchpad or trackpad, a media drive (e.g., a disk drive, a DVD drive, etc.), a port (e.g., a USB port, a FireWire port, an Ethernet port, etc.), a power control (e.g., a button, a switch, etc.), a WiFi network switch, a power cord outlet, a close or lock latch to help hold the device 10 closed, etc. In the illustrated embodiment, the base 34 includes the processor 16, the memory 18, the bus system 20, the network interface 22, the I/O interface 24, the storage device 26, and the display controller 28 illustrated in FIG. 5. In other embodiments, as will be appreciated by a person skilled in the art, any one or more of the processor 16, the memory 18, the bus system 20, the network interface 22, the I/O interface 24, the storage device 26 can be included in the lid 32 or can be located external to the lid 32 and the base 34, e.g., an external storage device plugged into a USB port, etc.

Figure 6:
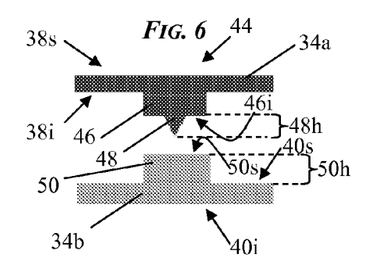
FIG. 6 is a schematic side view of an attachment point between two covers of the electronic device of FIG. 3 with the two covers unattached from one another.
Figure 7:
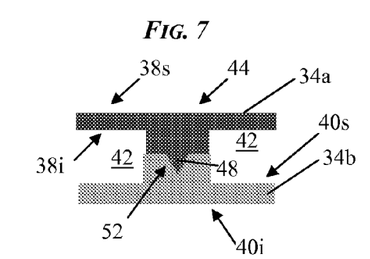
FIG. 7 is a schematic side view of the attachment point of FIG. 6 with the two covers attached to one another.

The base 34 can include a first cover 34a and a second cover 34b attached to the first cover 34a. The first cover 34a can have the keyboard 14 on a superior surface 38s thereof, as shown in FIG. 4. An inferior surface 38i of the first cover 34a, shown in FIGS. 6-8, can face a superior surface 40s of the second cover 34b at least when the base 34 is assembled, as shown in FIGS. 3, 4, and 7. As shown in FIG. 7, a cavity 42 can be defined between the first and second covers 34a, 34b, e.g., between the inferior surface 38i of the first cover 34a and the superior surface 40s of the second cover 34b, when the first and second covers 34a, 34b are attached together. One or more components of the device 10 can be contained within the space 42, e.g., the processor 16, the memory 18, etc.

An inferior surface 40i of the second cover 34b can be configured to face a support surface (not shown). The inferior surface 40i can include one or more feet (not shown) extending therefrom that can be configured to support the device 10 on the support surface. The feet can be formed from a non-slip, non-abrasive, non-marking material such as rubber, which can reduce chances of the device 10 from slipping on and from scratching, marking, or otherwise damaging the support surface.

In an exemplary embodiment, one of the first and second covers 34a, 34b can be formed from a first material, and another of the first and second covers 34a, 34b can be formed from a second, different material. The first material can be a harder material than the second material such that the first material can be configured to penetrate into and deform the second material. The deformation can be permanent. Examples of the first material include a metal such as magnesium, aluminum, etc. A person skilled in the art will appreciate that the first material can include a plurality of different components, e.g., a metal formed from a combination of two or more metals. Examples of the second material include a polymer such as a plastic (e.g., polycarbonate-acrylonitrile butadiene styrene (PC-ABS), etc.), etc. A person skilled in the art will appreciate that the second material can include a plurality of different components, e.g., a polymer formed from a combination of two or more polymers. The first material can be configured to penetrate into and deform the second material during manufacturing of the base 34 but not to penetrate into and deform the second material after the device 10 is manufactured, at least not during typical post-manufacturing use of the device 10. In other words, the first material can be configured to penetrate into and deform the second material during manufacturing when a sufficient force is applied and/or when subjected to a sufficiently high temperature, while when the device 10 is in typical post-manufacturing use conditions, the first material can be configured to not penetrate into and deform the second material.

As in the illustrated embodiment, the one of the first and second covers 34a, 34b can be formed entirely from the first material, and the other of the first and second covers 34a, 34b can be formed entirely from the second material. The first and second covers 34a, 34b each being formed of a single material can reduce cost of materials (e.g., require fewer materials to be purchased to produce the device 10) and/or can ease manufacturing (e.g., facilitate injection molding of the covers 34a, 34b). However, in some embodiments, one of a housing's first and second covers can be formed from the first material only at attachment points where the first cover is attached to the second cover and/or another of the housing's first and second covers can be formed from the second material only at the attachment points.

In the illustrated embodiment, as shown in FIGS. 3, 4, and 6-8, the first cover 34a is formed from the first material, and the second cover 34b is formed from the second material. In another embodiment, the second cover can be formed from the first material, and the first cover can be formed from the second material. In other words, in the illustrated embodiment, the base's cover 34b configured to rest on a support surface is formed from a softer material than the base's cover 34a to which it is attached, but in another embodiment, a base's cover configured to rest on a support surface can be formed from a harder material than the base's cover to which it is attached.

The first and second covers 34a, 34b can be non-removably attached together such that the base 34 is a singular unit. The first and second covers 34a, 34b can be independent, discrete elements that can be non-removably attached to one another during manufacturing of the base 34.

Figure 8:
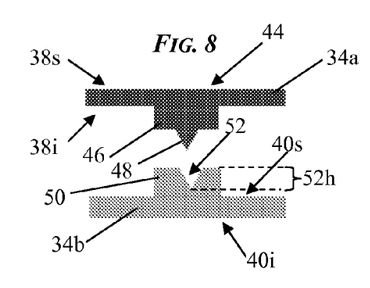
FIG. 8 is another schematic side view of the attachment point of FIG. 6 with the two covers unattached from one another.

The first and second covers 34a, 34b can be attached together in a variety of ways. The first and second covers 34a, 34b can be attached together at a plurality of attachment points. The device 10 can include any number of attachment points between the first and second covers 34a, 34b. In an exemplary embodiment, the attachment points can be positioned around perimeters of the first and second covers 34a, 34b, as in the illustrated embodiment in which the device 10 includes an attachment point at least at each of the base's corners, e.g., four attachment points for a rectangular base, around the base's perimeter. The attachment points can be spaced any distance apart from one another around the perimeter of the first cover 34a and the perimeter of the second cover 34b, e.g., equidistantly spaced therearound. One of the attachment points 44 of the device 10 is shown in FIGS. 6-8 and is discussed herein as a representative of the device's plurality of attachment points, which are each identical to the attachment point 44. In some embodiments, however, one or more attachments points of an electronic device can differ from one or more others of the device's attachment points.

At the attachment point 44, the inferior surface 38i of the first cover 34a can include a first attachment member 46 extending therefrom. The first attachment member 46 can have a variety of sizes, shapes, and configurations. In the illustrated embodiment, the first attachment member 46 has a circular cross-sectional shape and a cylindrical shape, but the first attachment member 46 can have other cross-sectional shapes, e.g., square, ovular, etc., and other shapes, e.g., cube-shaped, cone-shaped, trapezoidal, etc. The first attachment member 46 can have at least one protrusion 48 extending from an inferior surface 46i therefrom. In the illustrated embodiment, the at least one protrusion 48 is integrally formed with the first attachment member 46, which can facilitate manufacture of the first attachment member 46 and the at least one protrusion 48, e.g., by injection molding. The at least one protrusion 48 can, however, be a separate element that is non-removably attached to the first attachment member 46 before the first cover 34a is attached to the second cover 34b. The at least one protrusion 48 of the first cover 34a can be configured to penetrate into and deform the second cover 34b, as discussed further below. The at least one protrusion 48 can also have a variety of sizes, shapes, and configurations. In the illustrated embodiment, the at least one protrusion 48 has a triangular cross-sectional shape and a triangular prism shape, but the at least one protrusion 48 can have other cross-sectional shapes, e.g., square, ovular, hemi-spherical, etc., and other shapes, e.g., rectangular prism, cube, etc. In an exemplary embodiment, the at least one protrusion 48 can have a pointed tip, as in the illustrated embodiment, which can facilitate penetration of the at least one protrusion into the second cover 34b. The at least one protrusion 48 can extend across a diameter of the first attachment member 46, as in the illustrated embodiment. In other embodiments, the at least one protrusion can extend across only a partial length of the attachment member's inferior surface. Only one protrusion 48 is present in the illustrated embodiment, but the first cover's first attachment member 46 can include any number of protrusions, e.g., two, three, four, etc.

As mentioned above, the first cover 34a in the illustrated embodiment is formed entirely from the first material, but in another embodiment, only the at least one protrusion 48 configured to penetrate into the second cover 34b can be formed from the first material. Alternatively, only the first attachment member 46 and the at least one protrusion 48 can be formed from the first material with a remainder of the first cover 34a formed from one or more other materials. Forming only the first attachment member 46 and/or the at least one protrusion 48 from the first material can allow a remainder of the first cover 34a to be formed from a less expensive material than the first attachment member 46 and/or the at least one protrusion 48.

The first attachment member 46 and the at least one protrusion 48 can be solid, non-cannulated members, or one or both of the first attachment member 46 and the at least one protrusion 48 can have one or more holes formed therein and/or one or more internal cavities formed therein. The one or more holes can each be configured to seat a screw, pin, adhesive, and/or other connection member (not shown) configured to extend between the first and second covers 34a, 34b to help secure the first and second covers 34a, 34b together. In the illustrated embodiment, the at least one protrusion 48 is a solid, non-cannulated member, and the first attachment member 46 has a pair of holes in the form of passageways (not shown) extending therethrough on opposite sides of the at least one protrusion 48.

Also at the attachment point 44, the superior surface 40s of the second cover 34b can include a second attachment member 50 extending therefrom. The second cover's attachment member 50 can have a variety of sizes, shapes, and configurations. In an exemplary embodiment, the second cover's attachment member 50 can have a same size and shape as the first cover's attachment member 46. In this way, when the first and second covers 34a, 34b are attached at the attachment point 44, the attachment members 46, 50 can be aligned with one another without any overhang of one of the attachment members 46, 50 and without any protrusions or other extensions extending radially outward from either of the attachment members 46, 50, as shown in FIG. 7. Lacking overhang and radially-extending protrusions or other extensions can help maximize an area of the space 42 and hence room within the base 34 for device components.

As mentioned above, the second cover 34b in the illustrated embodiment is formed entirely from the second material, but in another embodiment, only the second attachment member 46 can be formed from the second material with a remainder of the second cover 34b formed from one or more other materials. Forming only the second attachment member 50 from the second material can allow a remainder of the second cover 34b to be formed from a less expensive material than the second attachment member 50 and/or to be formed from a harder material, e.g., the first material, which can help prevent scratches or other damage to the second cover 34b.

The second attachment member 50 can be a solid member, or the second attachment member 50 can have one or more holes formed therein and/or one or more internal cavities formed therein. The one or more holes can each be configured to seat a screw, pin, or other connection member, discussed above, configured to extend between the first and second covers 34a, 34b. In the illustrated embodiment, the second attachment member 50 has a pair of passageways in the form of holes (not shown) extending therethrough that are configured to axially align with the pair of passageways of the first attachment member 46 when the first and second attachment members 46, 50 are mated together, as shown in FIG. 7.

Before the first and second attachment members 46, 50 are mated together, a superior surface 50s of the second attachment member 50 can be free of protrusions extending therefrom and depressions formed therein, as shown in FIG. 6. In other words, the second attachment member's superior surface 50s can be a planar surface and/or a smooth surface. A person skilled in the art will appreciate that due to one or more factors such as machining tolerances, the second attachment member's superior surface 50s can be planar and/or smooth while having very slight protrusions and/or depressions.

When the first and second attachment members 46, 50 are mated together, as shown in FIG. 7, the at least one protrusion 48 can be configured to penetrate into and deform the second attachment member 50 so as to form at least one depression 52 therein. The second attachment member 50 being formed of the second material that is softer than the first material from which the at least one protrusion 48 is made allows the at least one protrusion 48 to penetrate into and deform the second attachment member 50. The at least one protrusion 48 can be configured to penetrate into the superior surface 50s of the second attachment member 50 such that the depression 52 extends from the second attachment member's superior surface 50s toward the inferior surface 40i of the second cover 34b. In an exemplary embodiment, the at least one protrusion 48 has a height 48h, shown in FIG. 6, that is less than a height 50h of the second attachment member 50. In this way, the at least one depression 52 formed in the second attachment member 50, as well as the at least one protrusion 48 seated therein, can be contained entirely within the second attachment member 50, thereby preventing the at least one protrusion 48 from penetrating through the first cover 34b so as to puncture or otherwise damage the inferior surface 40i of the second cover 34b. The at least one depression 52 can have a height 52h, shown in FIG. 8, defined by the at least one protrusion 48, since the at least one protrusion 48 forms the at least one depression 52. In an exemplary embodiment, the at least one protrusion 48 is entirely disposed within the second attachment member 50, as shown in FIG. 7, when the first and second covers 34a, 34b are mated together such that the height 52h of the at least one depression 52 is equal to the height 48h of the at least one protrusion 48. If the first attachment member includes a plurality of protrusions, each of the plurality of protrusions can have a height less than a height of the second attachment member such that each of the plurality of protrusions and each of the plurality of depressions formed by respective one of the plurality of protrusions can be contained entirely within the second attachment member.

The second attachment member 50 can thus be configured to change from a first state in which the superior surface 50s thereof has no depressions formed therein to a second state in which the superior surface 50s has at least one depression 52 formed therein. In an exemplary embodiment, the at least one depression 52 is permanently formed in the second material of the second cover 34a by the at least one protrusion 48. FIG. 6 shows the second attachment member 50 in the first state, and FIGS. 7 and 8 show the second attachment member 50 in the second state. For clarity of illustration, FIG. 8 shows the first and second attachment members 46, 50 separated from one another after the at least one protrusion 48 of the first cover 34a has formed the at least one depression 52 in the second cover 34b. In an exemplary embodiment, the first and second covers 34a, 34b are non-removably attached to one another after the at least one protrusion 48 of the first cover 34a forms the at least one depression 52 and would not be separated from one another as shown in FIG. 8. In other words, once the at least one protrusion 48 forms the at least one depression 52 and is seated therein, the at least one protrusion 48 is not removed from the at least one depression 52, which can help prevent any gap space from developing between the first and second covers 34a, 34b at the attachment point 44, e.g., if the at least one protrusion 48 is removed from the at least one depression 52 and does not subsequently engage the second attachment member 50 at the exact same angle, position, etc. as when the at least one protrusion 48 first engaged the second attachment member 50 so as to form the at least one depression 52 therein.

The zero gap space at the attachment point 44 can be formed using molding technology, e.g., injection molding of the second cover 34b formed from the second, softer material, and casting technology, e.g., metal casting of the first cover 34a formed from the first, harder material. Thus, more expensive machining need not be used to manufacture the first cover or the second cover.

The first cover 34a can include one or more stop mechanisms configured to stop penetration of the at least one protrusion 48 into the second attachment member 50 beyond a threshold amount of penetration. The stop mechanism(s) can thus be configured to help prevent the at least one protrusion 48 from penetrating enough to puncture or otherwise damage the inferior surface 40i of the second cover 34b. The stop mechanism(s) can have a variety of sizes, shapes, and configurations. In an exemplary embodiment, the inferior surface 46i of the first attachment member 46 can be configured as a stop mechanism. The inferior surface 46i of the first attachment member 46 can be configured to abut the superior surface 50s of the second attachment member 50 when the first and second attachment members 46, 50 are mated together, as shown in FIG. 7, the abutting stopping advancement of the at least one protrusion 48 into the second attachment member 50.

As shown in FIG. 7, when the first and second covers 34a, 34b are mated together, the at least one protrusion 48 can be seated in the at least one depression 52 with no gap space therebetween. Because the at least one protrusion 48 can form the at least one depression 52, the at least one depression 52 can have a size and shape that precisely corresponds to the at least one protrusion 48. In other words, the size and shape of the at least one depression 52 can be defined by the at least one protrusion 48 such that no gap space exists between the at least one protrusion 48 and the second attachment member 50. This lack of gap space can prevent the at least one protrusion 48 from rotating and from otherwise moving relative to the second attachment member 50. The first cover 34a can thus be prevented from rotating or otherwise moving relative to the second cover 34b when the attachment members 46, 50 are mated together. Additionally, no gap space can exist between the first attachment member 46 and the second attachment member 50 because of the abutment of the first attachment member's inferior surface 46i and the second attachment member's superior surface 50s. Thus, no gap space can exist between the first and second covers 34a, 34b at the attachment point 44. This lack of gap space can further help prevent the first cover 34a from rotating or otherwise moving relative to the second cover 34b when the attachment members 46, 50 are mated together. In an embodiment in which the first attachment member's inferior surface 46i and the second attachment member's superior surface 50s do not abut, the first cover 34a can still be prevented from rotating or otherwise moving relative to the second cover 34b when the attachment members 46, 50 are mated together by the lack of gap space between the at least one protrusion 48 and the second attachment member 50.

A minimum force required to penetrate the first material, e.g., the at least one protrusion 48, into the second material, e.g., into the second attachment member 50, can be greater than a maximum force that the first cover 34a and/or second cover 34b are subjected to during typical shipping and use of the device 10. In other words, the minimum force can be a force that can be relatively easily generated in a manufacturing setting, e.g., through the use of machinery such as mechanical clamps, etc., as will be appreciated by a person skilled in the art, but that is a force not typically generated with respect to the device 10 in a post-manufacturing setting, e.g., during typical shipping and use of the device 10. The at least one protrusion 48 will thus not shift position with respect to the at least one depression 52 after at least one protrusion 48 is seated therein, absent highly atypical, non-recommended shipping and/or use of the device 10 that subjects to the device 10 to an atypical force. The one or more connection members extending between the first and second attachment members 46, 50 can help prevent the at least one protrusion 48 from shifting in position relative to the at least one depression 52 after being seated therein, even if the device 10 is subjected to an atypical force post-manufacturing. The lack of gap space between the at least one protrusion 48 and the at least one depression 52 can thus be maintained throughout typical shipping and use of the device 10, which can help prevent the covers 34a, 34b from twisting or otherwise shifting relative to one another so as to prevent the device 10 from tilting and/or rocking.

In the illustrated embodiment, the first cover 34a including the display 12 is formed from the first material and has the at least one protrusion 48 extending therefrom that is configured to penetrate into and deform the second cover 34b, which is formed from the second material. In another embodiment, a cover of an electronic device that is formed of the second material can include a display. Another cover of the electronic device that does not include a display can be formed from the first material and can be configured to penetrate into and deform the cover that includes the display. Similarly, in the illustrated embodiment, the second cover 34*b*, which is formed from the second material and includes the keyboard 14, is configured to be penetrated into and deformed by the first cover 34*a*. In another embodiment, a cover of an electronic device that is formed of the first material can include a keyboard and/or other I/O unit, e.g., a touch pad, track ball, etc. Another cover of the electronic device that does not include a keyboard and/or other I/O unit can be formed from the second material and can be configured to be penetrated into and deformed by the cover that includes the keyboard and/or other I/O unit.

Elements discussed herein with reference to any electronic device can generally be configured similar to like-named elements discussed herein.

Figure 9:
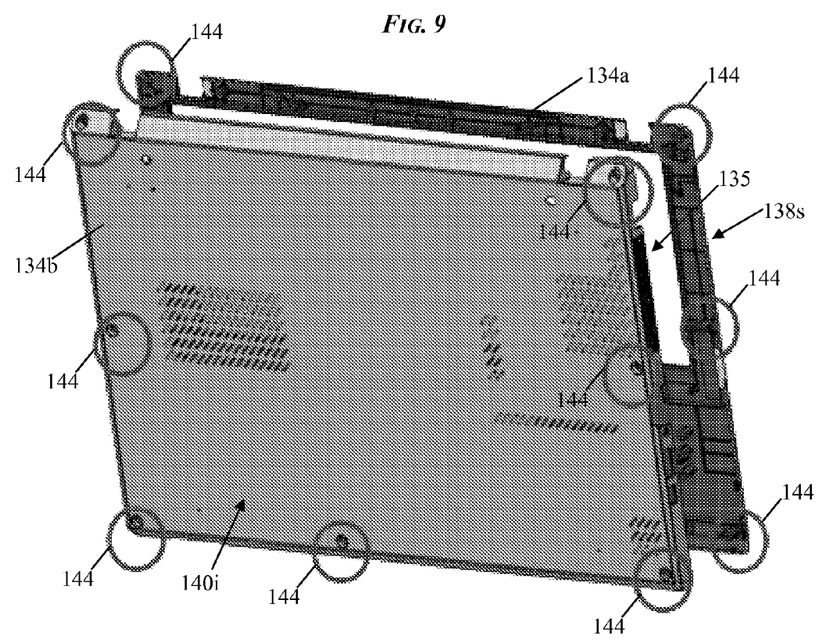
FIG. 9 is a perspective view of embodiments of two covers of an electronic device, the covers unattached from one another.

FIG. 9 illustrates another embodiment of a first cover 134*a* of an electronic device configured to attach to a second cover 134*b* of the electronic device. The first cover 134*a* can include a display (not shown) seated in a display space 135 on a superior surface 138*s* of the first cover 134*a*. An inferior surface 140*i* of the second cover 134*b* can be configured to rest on a support surface (not shown). The first and second covers 134*a*, 134*b* in the illustrated embodiment are configured to attach to one another at seven attachment points 144, each encircled by a circle for ease of identification in FIG. 9. The first and second covers 134*a*, 134*b* include attachment points 144 at each of four corners and at intermediate portions along three sides thereof, although as discussed above, an electronic device can include any number of attachment points 144 at a variety of locations.

Figure 10:
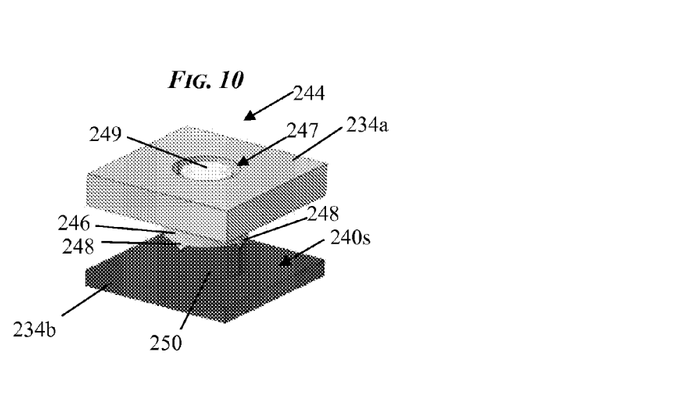
FIG. 10 is a perspective view of an embodiment of an attachment point between two covers of an electronic device, the two covers attached to one another.
Figure 11:
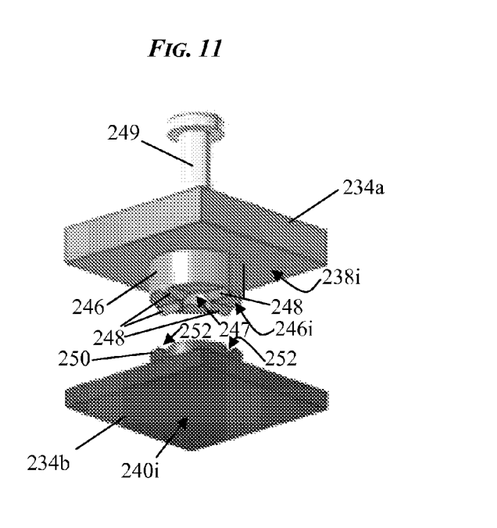
FIG. 11 is a perspective view of the attachment point of FIG. 10, the two covers unattached from one another.
Figure 12:
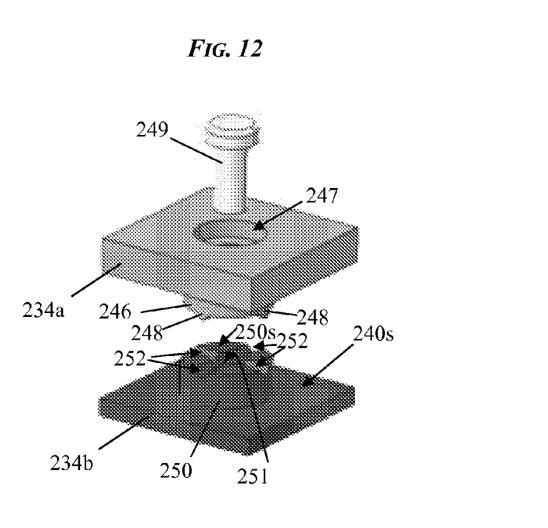
FIG. 12 is another perspective view of the attachment point of FIG. 10, the two covers unattached from one another.

FIGS. 10-12 illustrate another embodiment of a first cover 234*a* of an electronic device configured to attach to a second cover 234*b* of the electronic device. The first and second covers 234*a*, 234*b* are only shown in FIGS. 10-12 at one attachment point 244 of the electronic device. The electronic device can, as discussed above, include any number of attachment points. At the attachment point 244, an inferior surface 238*i* of the first cover 234*a* can include a first attachment member 246 extending therefrom. In the illustrated embodiment, the first attachment member 246 has a circular cross-sectional shape, has a cylindrical shape, has at least one passageway 247 extending therethrough, and has at least one protrusion 248 extending from an inferior surface 246*i* therefrom. Four protrusions 248 extend from the first attachment member 246 in the illustrated embodiment. When a first attachment member includes a plurality of protrusions extending therefrom, the protrusions 248 can, as in the illustrated embodiment, be arranged equidistantly radially around the second attachment member's inferior surface 246*i*. When a first attachment member includes at least passageway extending therethrough, the protrusions 248 can, as in the illustrated embodiment, be arranged around a central passageway 247. In the illustrated embodiment, the at least one protrusion 248 is integrally formed with the first attachment member 246. In the illustrated embodiment, the protrusions 248 are identical to one another, each having a triangular cross-sectional shape, a triangular prism shape, and a pointed tip. In another embodiment, one or more of the protrusions can differ from one or more of the other protrusions. As shown in FIG. 11, each of the protrusions 248 in the illustrated embodiment extends across only a partial portion of the attachment member's inferior surface 246*i*.

The at least one passageway 247 can be configured to seat a connection member, e.g., a pin 249, configured to extend between the first and second covers 234*a*, 234*b* to help secure the first and second covers 234*a*, 234*b* together. The at least one passageway 247 that extends through the first attachment member 246 can also extend through the first cover 234*a*, as shown in FIGS. 10-12, which can facilitate coupling of the pin 249 to the first cover 234*a*.

Also at the attachment point 244, a superior surface 240*s* of the second cover 234*b* can include a second attachment member 250 extending therefrom. In the illustrated embodiment, the second attachment member 250 has a circular cross-sectional shape, has a cylindrical shape, has at least one passageway 251 extending therethrough. The at least one passageway 251 of the second cover 234*b* can be configured to axially aligned with the at least one passageway 247 of the first cover 234*a* when the first and second covers 234*a*, 234*b* are mated together, as shown in FIG. 10, such that a connection member, e.g., the pin 249, can extend between the first and second covers 234*a*, 234*b*.

Before the first and second attachment members 246, 250 are mated together, a superior surface 250*s* of the second attachment member 250 can be free of protrusions extending therefrom and depressions formed therein. When the first and second attachment members 246, 250 are mated together, as shown in FIG. 10, the at least one protrusion 248 can be configured to penetrate into and deform the second attachment member 250 so as to form a corresponding number of depressions 252 therein. The at least one protrusion 248 can be configured to penetrate into a superior surface 250*s* of the second attachment member 250 such that the at least one depression 252 extends from the second attachment member's superior surface 250*s* toward an inferior surface 240*i* of the second cover 234*b*. In the illustrated embodiment, as shown in FIG. 10, each of the protrusions 248 has a height that is less than a height of the second attachment member 250, thereby allowing each of the depressions 252 formed in the second attachment member 250, as well as the protrusions 248 seated therein, to be contained entirely within the second attachment member 250. The first cover 234*a* include a stop mechanism in the form of the inferior surface 246*i* of the first attachment member 246, the stop mechanism being configured to stop penetration of the at least one protrusion 248 into the second attachment member 250 beyond a threshold amount of penetration.

FIGS. 10-12 show the second attachment member 250 in a second state in which the superior surface 250*s* thereof has at least one depression 252 formed therein, as opposed to a first state in which the second attachment member's superior surface 250*s* is free of depressions formed therein. FIGS. 11 and 12 show the first and second covers 234*a*, 234*b* unattached from one another. FIG. 10 shows the first and second covers 234*a*, 234*b* attached together each of the protrusions 248 seated in respective ones of the depressions 252 without any gap space between the protrusions 248 and their respective ones of the depressions 252 and without any gap space between the first attachment member 246 and the second attachment member 250. For clarity of illustration, FIGS. 11 and 12 show first and second attachment members 246, 250 separated from one another after the at least one protrusion 248 of the first cover 234*a* has formed the at least one depression 252 in the second cover 234*b*. In an exemplary embodiment, the first and second covers 234*a*, 234*b* are non-removably attached to one another after the at least one protrusion 248 of the first cover 234*a* forms the at least one depression 252 and would not be separated from one another as shown in FIGS. 11 and 12.

Although the invention has been described by reference to specific embodiments, a person skilled in the art will understand that numerous changes may be made within the spirit and scope of the inventive concepts described. A person skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. An apparatus, comprising:
    a first cover of an electronic device having an inferior surface and a superior surface; and
    a second cover of the electronic device having an inferior surface and a superior surface, the superior surface of the second cover being attached to the inferior surface of the first cover at a plurality of attachment points;
    wherein at each of the attachment points, one of the superior surface of the second cover and the inferior surface of the first cover has one or more protrusions extending therefrom that are seated in corresponding one or more depressions formed in another of the superior surface of the second cover and the inferior surface of the first cover with no gap space therebetween such that the first cover cannot rotate relative to the second cover, and
    wherein one of the first and second covers is formed from a metal, and the other of the first and second covers is formed from an inelastic polymer such that the metal can penetrate into and deform the polymer.

2. The apparatus of claim 1, further comprising a connection member at each of the attachment points, the connection member being seated in a hole formed through the superior surface of the second cover and the inferior surface of the first cover.

3. The apparatus of claim 2, wherein the one or more protrusions comprises a plurality of protrusions, the one or more depressions comprises a plurality of depressions, and at each of the attachments points, the plurality of protrusions and the plurality of depressions are positioned radially around the connection member.

4. The apparatus of claim 2, wherein at each of the attachments points, the one or more protrusions and the one or more depressions extend through the connection member.

5. The apparatus of claim 1, wherein the inferior surface of the second cover has a plurality of feet extending therefrom, each of the feet being configured to rest on a table surface.

6. The apparatus of claim 1, further comprising a third cover having a display thereon, the third cover being movably attached to the first and second covers such that the electronic device can be moved between an open position and a closed position;
    wherein when the electronic device is in the open position, the display is configured for visualization by a user, and when the electronic device is in the closed position, the display is not configured for visualization by the user.

7. The apparatus of claim 1, further comprising a processor positioned between the inferior surface of the first cover and the superior surface of the second cover; and
    a display coupled to the first and second covers, the processor being configured to cause data to be displayed on the display.

8. The apparatus of claim 1, wherein the electronic device comprises any one of a mobile telephone, a smartphone, a computer, a DVD player, a CD player, a portable music player, a gaming system, a television, a radio, and a personal digital assistant.

9. The apparatus of claim 1, wherein both the superior surface of the second cover and the inferior surface of the first cover have one or more attachment members extending therefrom.

10. The apparatus of claim 9, wherein the one or more protrusions and the one or more depressions are formed in the one or more of the attachment members.

11. An apparatus, comprising:
    a first cover of an electronic device, the first cover having a plurality of holes formed therein, each of the holes having a plurality of protrusions positioned radially therearound;
    a second cover of the electronic device having a plurality of holes formed therein, the plurality of protrusions being pressed into the second cover such that a plurality of depressions are formed in the second cover in which the plurality of protrusions are seated without any gap space therebetween and such that the holes of the first cover are aligned with the holes of the second cover; and
    a plurality of connection members, each of the connection members extending through one of the holes of the first cover and one the holes of the second cover such that each of the connection members has a plurality of the protrusions and a plurality of the depressions positioned radially therearound.

12. The apparatus of claim 11, wherein the plurality of holes of the first cover are positioned around a perimeter of the first cover, and the plurality of holes of the second cover are positioned around a perimeter of the second cover.

13. The apparatus of claim 11, wherein each of the plurality of protrusions are formed from a first material, the second cover being formed from a second material at least where the depressions are formed therein, and the first material is harder than the second material.

14. The apparatus of claim 13, wherein the first material comprises a metal, and the second material comprises a polymer.

15. A method, comprising:
    connecting a first cover of an electronic device to a second cover of the electronic device such that at each of a plurality of attachments points between the first and second covers, protrusions extending from the first cover press into the second cover so as to permanently deform the second cover to have a plurality of depressions therein, with no gap space between the protrusions and the depressions; and
    positioning a connection member at each of the attachment points such that each of the connection members extends between the first and second covers and holds the first and second cover together in a fixed position relative to one another.

16. The method of claim 15, further comprising:
    attaching a plurality of feet to the second cover, each of the feet being configured to rest on a table surface; and
    attaching a display to the first cover.

17. The method of claim 15, further comprising:
    attaching a plurality of feet to the first cover, each of the feet being configured to rest on a table surface; and
    attaching a display to the second cover.

18. The method of claim 15, further comprising attaching a third cover to the first and second covers such that the electronic device can be moved between an open position and a closed position, the third cover having a display thereon, the electronic device in the open position allowing data displayed on the display to be visualized by a user, and the electronic device in the closed position not allowing data displayed on the display to be visualized by the user.

19. The method of claim 15, wherein the electronic device comprises any one of a mobile telephone, a smartphone, a computer, a DVD player, a CD player, a portable music player, a gaming system, a television, a radio, and a personal digital assistant.

\* \* \* \* \*